United States Patent
Meacham (10) Patent No.: US 10,371,755 B2
(45) Date of Patent: Aug. 6, 2019

(54) REPORTED STATE-OF-CHARGE SCALING (71) Applicant: FAIRCHILD SEMICONDUCTOR CORPORATION, San Jose, CA (US)

(72) Inventor: James Meacham, Gorham, ME (US)

(73) Assignee: Fairchild Semiconductor Corporation, Phoenix, AZ (US)

( * ) Notice: Subject to any disclaimer, the term of this patent is extended or adjusted under 35 U.S.C. 154(b) by 422 days.

(21) Appl. No.: 14/741,262

(22) Filed: Jun. 16, 2015

(65) Prior Publication Data
US 2016/0109529 A1 Apr. 21, 2016

Related U.S. Application Data (60) Provisional application No. 62/066,638, filed on Oct. 21, 2014.

(51) Int. Cl.
*G01R 31/36* (2019.01)
*G01R 31/371* (2019.01)
*H02J 7/00* (2006.01)
*G01R 31/367* (2019.01)
*G01R 35/00* (2006.01)

(52) U.S. Cl.
CPC ......... *G01R 31/371* (2019.01); *G01R 31/367* (2019.01); *H02J 7/0047* (2013.01); *G01R 31/36* (2013.01); *G01R 35/005* (2013.01)

(58) Field of Classification Search
CPC .............................. G01R 31/36; G01R 31/3689
USPC .......................................................... 702/63
See application file for complete search history.

(56) References Cited

U.S. PATENT DOCUMENTS

| | | | | | |
|---|---|---|---|---|---|
| 3,984,762 | A | * | 10/1976 | Dowgiallo, Jr. | G01R 25/00 324/430 |
| 4,045,721 | A | * | 8/1977 | Swain | G05D 21/02 204/400 |
| 4,207,514 | A | * | 6/1980 | Klein | H02J 7/0078 320/134 |

(Continued)

FOREIGN PATENT DOCUMENTS

CN 103185865 A 7/2013
CN 103399278 A 11/2013

(Continued)

OTHER PUBLICATIONS

White Paper—Estimating the State of Charge of Li-Ion Batteries, retrieved from: http://liionbms.com/php/wp_soc_estimate.php, Jan. 10, 2009, 9 pages.

(Continued)

*Primary Examiner* — Ly D Pham
(74) *Attorney, Agent, or Firm* — Brake Hughes Bellermann LLP (57) ABSTRACT

In a general aspect, a method can include providing an indication that the electronic device has changed from a battery charging state to a battery discharging state and measuring an initial measured state-of-charge (MSOC) value of a battery of the electronic device. In the event the initial MSOC value is above a threshold value, the method can further include determining a compensation value based on the initial MSOC value and the threshold value, determining an initial reported state of charge (RSOC) value by scaling the initial MSOC value using the compensation value and reporting the initial RSOC value using the electronic device.

20 Claims, 4 Drawing Sheets

(56) References Cited

U.S. PATENT DOCUMENTS

| | | | | |
|---|---|---|---|---|
| 4,520,353 | A * | 5/1985 | McAuliffe | G01R 19/16542 324/429 |
| 4,661,759 | A * | 4/1987 | Klein | G01R 31/3665 320/134 |
| 5,164,652 | A * | 11/1992 | Johnson | H01M 6/5066 320/106 |
| 5,698,965 | A | 12/1997 | York | |
| 5,847,566 | A * | 12/1998 | Marritt | G01R 31/362 324/427 |
| 8,203,305 | B1 * | 6/2012 | Wortham | G01R 31/3651 320/106 |
| 8,930,070 | B2 * | 1/2015 | Boehm | G01R 31/3606 324/434 |
| 9,197,089 | B2 * | 11/2015 | Choe | H02J 7/007 |
| 2005/0189920 | A1 * | 9/2005 | Koch | G01R 31/3651 320/132 |
| 2006/0061322 | A1 * | 3/2006 | Yamazaki | B60K 6/48 320/104 |
| 2009/0099799 | A1 * | 4/2009 | Barsoukov | G01R 31/3606 702/63 |
| 2009/0321163 | A1 * | 12/2009 | Suzui | B60K 6/365 180/65.265 |
| 2010/0244847 | A1 * | 9/2010 | Kudo | B60L 3/0046 324/433 |
| 2012/0025769 | A1 * | 2/2012 | Kikuchi | B60L 3/0046 320/118 |
| 2012/0256752 | A1 * | 10/2012 | Musser | H02J 7/041 340/636.2 |
| 2013/0275067 | A1 | 10/2013 | Mikuteit et al. | |
| 2014/0028681 | A1 * | 1/2014 | Hirayama | G01R 31/3606 345/440 |
| 2015/0084639 | A1 * | 3/2015 | Joe | G01R 31/3651 324/428 |
| 2015/0276885 | A1 * | 10/2015 | K.R. | G01R 31/3651 702/63 |
| 2015/0298555 | A1 * | 10/2015 | Bennett | B60L 1/003 701/22 |
| 2016/0202324 | A1 * | 7/2016 | Biletska | G01R 31/3651 702/63 |

FOREIGN PATENT DOCUMENTS

| | | |
|---|---|---|
| CN | 104007390 A * | 8/2014 |
| JP | 2000152420 A | 5/2000 |

OTHER PUBLICATIONS

State of Charge (SoC) Meter User Guide, Lithionics Battery LLC, Apr. 30, 2014, 12 pages.

* cited by examiner

REPORTED STATE-OF-CHARGE SCALING

CROSS-REFERENCE TO RELATED APPLICATIONS

This application claims priority to and the benefit of U.S. Provisional Application No. 62/066,638, filed Oct. 21, 2014, entitled "REPORTED STATE-OF-CHARGE SCALING", the disclosure of which is hereby incorporated by reference in its entirety.

TECHNICAL FIELD

This description relates to measurement and reporting of state-of-charge. In particular, the description relates to improving reporting of battery state-of-charge, such as reporting battery state-of-charge for an electronic device.

SUMMARY

In a general aspect, a method can include determining, by an electronic device, that the electronic device has changed from a battery charging state to a battery discharging state. The method can also include measuring, by the electronic device, an initial measured state-of-charge (MSOC) value of a battery of the electronic device. The method can also include, in the event the initial MSOC value is above a threshold value, determining a compensation value based on the initial MSOC value and the threshold value; determining an initial reported state of charge (RSOC) value by scaling the initial MSOC value using the compensation value; and reporting the initial RSOC value using the electronic device.

Implementations can include one or more of the following features. For instance, the threshold value can be a predetermined full-charge threshold value for the battery of the electronic device. The compensation value can be a difference between the initial MSOC value and the threshold value. The initial RSOC value can be a minimum value of a percentage value determined by the initial MSOC value divided by a sum of the threshold value and the compensation value and one-hundred percent. The reporting the initial RSOC value can include displaying a percentage value corresponding with the initial RSOC value on a display of the electronic device.

The method can include detecting a decrease in a state-of-charge (SOC) of the battery from the initial MSOC value, and, in response to the detecting, measuring a changed MSOC value of the battery; determining a modified RSOC value by scaling the changed MSOC value using the compensation value; and reporting the modified RSOC value using the electronic device. The method can include, prior to determining the modified RSOC value, amortizing the compensation value based on a predetermined range of MSOC values to produce an amortized compensation value. The determining of the modified RSOC value can be based on the amortized compensation value.

The decrease in the SOC can be a first decrease, the changed MSOC value can be a first changed MSOC value, the amortized compensation value can be a first amortized compensation value, and the modified RSOC value can be a first modified RSOC value. The method can include detecting a second decrease in a state-of-charge (SOC) of the battery from the first changed MSOC value and, in response to the detecting the second decrease, measuring a second changed MSOC value of the battery and further amortizing the first amortized compensation value to determine a second amortized compensation value. In the event the second amortized compensation value is greater than zero, the method can include determining a second modified RSOC value by scaling the second changed MSOC value using the second amortized compensation value and reporting the second modified RSOC value using the electronic device.

In another general aspect, a method can include determining, by an electronic device, that the electronic device has changed from a battery discharging state to a battery charging state. The method can also include measuring, by the electronic device, an initial measured state-of-charge (MSOC) value of a battery of the electronic device. The method can further include determining whether a previously determined reported state of charge compensation value (RSOC_CV) of the electronic device is greater than zero. In the event the previously determined RSOC_CV is greater than zero, the method can also further include determining an initial reported state of charge (RSOC) value by scaling the initial MSOC value using the previously determined RSOC_CV and reporting the initial RSOC value using the electronic device.

Implementations can include one or more of the following features. For example, the initial RSOC value can be a minimum value of a percentage value determined by the initial MSOC value divided by a sum of a full-charge threshold value of the electronic device and the previously determined RSOC_CV and one-hundred percent. The reporting of the initial RSOC value can include displaying a percentage value corresponding with the initial RSOC value on a display of the electronic device.

The method can include detecting an increase in a state-of-charge (SOC) of the battery from the initial MSOC value and, in response to the detecting, measuring a changed MSOC value of the battery; determining a modified RSOC value by scaling the changed MSOC value using the previously determined RSOC_CV; and reporting the modified RSOC value using the electronic device.

The method can include detecting an increase in a state-of-charge (SOC) of the battery from the initial MSOC value. In response to the detecting, the method can include measuring a changed MSOC value of the battery; amortizing the previously determined RSOC_CV to determine an amortized RSOC_CV, where the amortizing can be across a range of MSOC values determined by a difference between a full-charge threshold value and the initial MSOC value; determining a modified RSOC value by scaling the changed MSOC value using the amortized RSOC_CV; and reporting the modified RSOC value using the electronic device.

The increase in the SOC can be a first increase in the SOC, the changed MSOC value can be a first changed MSOC value, the amortized RSOC_CV can be a first amortized RSOC_CV, and the modified RSOC value can be a first modified RSOC value. The method can include detecting a second increase in a state-of-charge (SOC) of the battery from the first changed MSOC value. In response to the detecting the second increase, the method can include measuring a second changed MSOC value of the battery and further amortizing the first amortized RSOC_CV to determine a second amortized RSOC_CV. In the event the second amortized RSOC_CV is greater than zero, the method can include determining a second modified RSOC value by scaling the second changed MSOC value using the second amortized RSOC_CV and reporting the second modified RSOC value using the electronic device.

In another general aspect, an electronic device can include a battery, a charging circuit, a battery fuel gauge operatively coupled with the battery and the charging circuit, at least one processor and at least one non-transitory storage medium having instructions stored thereon. The instructions, when executed by the at least one processor, can result in the battery fuel gauge receiving an indication that the electronic device has changed from a battery charging state to a battery discharging state and measuring, by the battery fuel gauge, an initial measured state-of-charge (MSOC) value of the battery. In the event the initial MSOC value is above a threshold value, the instructions, when executed by the at least one processor, can cause the battery fuel gauge to determine a compensation value based on the initial MSOC value and the threshold value; determine an initial reported state of charge (RSOC) value by scaling the initial MSOC value using the compensation value; and report the initial RSOC value on a display of the electronic device.

Implementations can include one or more of the following features. For example, the instructions, when executed by the at least one processor, can cause the battery fuel gauge to detect a decrease in a state-of-charge (SOC) of the battery from the initial MSOC value and, in response to the detecting, measure a changed MSOC value of the battery; amortize the compensation value to determine an amortized compensation value, the amortizing being across a range of MSOC values; determine a modified RSOC value by scaling the changed MSOC value using the amortized compensation; and report the modified RSOC value using the electronic device.

The decrease in the SOC can be a first decrease, the changed MSOC value can be a first changed MSOC value, the amortized compensation value can be a first amortized compensation value, and the modified RSOC value can be a first modified RSOC value. The instructions, when executed by the at least one processor, can cause the battery fuel gauge to detect a second decrease in a state-of-charge (SOC) of the battery from the first changed MSOC value and, in response to the detecting the second decrease, measure a second changed MSOC value of the battery and further amortize the compensation value to determine a second amortized compensation value. In the event the second amortized compensation value is greater than zero, the instructions, when executed by the at least one processor, can cause the battery fuel gauge to determine a second modified RSOC value by scaling the second changed MSOC value using the second amortized compensation value and report the second modified RSOC value using the electronic device.

The indication that the electronic device has changed from a battery charging state to a battery discharging state can be provided by the charging circuit. The charging circuit can be a first charging circuit. The electronic device can include a second charging circuit that is operatively coupled with the battery and the battery fuel gauge. The second charging circuit can be configured to provide the indication that the electronic device has changed from the battery charging state to the battery discharging state.

In another general aspect, an electronic device can include a battery, a charging circuit, a battery fuel gauge operatively coupled with the battery and the charging circuit, at least one processor and at least one non-transitory storage medium having instructions stored thereon. The instructions, when executed by the at least one processor, can result in the battery fuel gauge receiving an indication that the electronic device has changed from a battery discharging state to a battery charging state; measuring, by the battery fuel gauge, an initial measured state-of-charge (MSOC) value of a battery of the electronic device; and determining whether a previously determined reported state of charge compensation value (RSOC_CV) of the electronic device is greater than zero. In the event the previously determined RSOC_CV is greater than zero, the instructions, when executed by the at least one processor, can cause the battery fuel gauge to determine an initial reported state of charge (RSOC) value by scaling the initial MSOC value using the previously determined RSOC_CV and report the initial RSOC value using the electronic device.

Implementations can include one or more of the following features. For instance, the instructions, when executed by the at least one processor, can cause the battery fuel gauge to detect an increase in a state-of-charge (SOC) of the battery from the initial MSOC value and, in response to the detecting, measure a changed MSOC value of the battery and amortize the previously determined RSOC_CV to produce an amortized RSOC_CV, the amortizing being across a range of MSOC values determined by a difference between a full-charge threshold value and the initial MSOC value. In the event the amortized RSOC_CV is greater than zero, the instructions, when executed by the at least one processor, can cause the battery fuel gauge to determine a modified RSOC value by scaling the changed MSOC value using the amortized RSOC_CV and report the modified RSOC value using a display of the electronic device.

The increase in the SOC can be a first increase in the SOC, the changed MSOC value can be a first changed MSOC value, the amortized RSOC_CV can be a first amortized RSOC_CV and the modified RSOC value can be a first modified RSOC value. The instructions, when executed by the at least one processor, can cause the battery fuel gauge to detect a second increase in a state-of-charge (SOC) of the battery from the first changed MSOC value. In response to the detecting the second increase, the instructions, when executed by the at least one processor, can cause the battery fuel gauge to measure a second changed MSOC value of the battery and further amortize the first amortized RSOC_CV to determine a second amortized RSOC_CV. In the event the second amortized RSOC_CV is greater than zero, the instructions, when executed by the at least one processor, can cause the battery fuel gauge to determine a second modified RSOC value by scaling the second changed MSOC value using the second amortized RSOC_CV and report the second modified RSOC value using display of the electronic device.

The indication that the electronic device has changed from a battery discharging state to a battery charging state can be provided by the charging circuit. The charging circuit can be a first charging circuit. The electronic device can include a second charging circuit that is operatively coupled with the battery and the battery fuel gauge. The second charging circuit can be configured to provide the indication that the electronic device has changed from the battery discharging state to the battery charging state.

DETAILED DESCRIPTION

Electronic devices, such as consumer electronic devices including smartphones, tablets, laptops and so forth, may include one or more charging systems (e.g. circuits) that are configured to recharge a battery (e.g., a lithium-ion battery or other rechargeable power source) that is included in a given electronic device. For instance, an electronic device may have a first circuit that is configured to charge a battery of the device via power supplied to the electronic device via a wired connection, such as from a wall outlet or a universal serial port that supplies power to the electronic device for charging its battery. Such an electronic device may also include a second charging circuit that charges the battery wirelessly, such as using an inductive circuit that charges the battery using electromagnetic energy generated by a wireless charger. Depending on which charging circuit is used to charge the electronic device's battery (or as a result of other variations in charging conditions), the measured state-of-charge of the battery after "fully" charging the battery (e.g., the given charging circuit detects that the battery is fully charged) may vary from the battery's actual fully charged state-of charge capacity.

Such electronic devices may also include a fuel gauge or battery fuel gauge that is configured to measure and report state-of-charge for an electronic device's battery. Such a fuel gauge may be implemented using hardware, software and/or firmware. In order to account for differences in state-of-charge, such as those discussed above, when reporting the battery's state of charge (e.g., to a user of the electronic device), current approaches for reporting measured state-of charge (e.g., using a battery fuel gauge) may be implemented using a state-of-charge buffer value, which can also be referred to as a full-scale delta value (FS_DELTA) or a full-charge delta value (FC_DELTA). For purposes of this disclosure, and for purposes of clarity, such a buffer value will be referred to as a full-charge delta value or FC_DELTA. FC_DELTA for a given electronic device may be a percentage of its battery's actual fully charged state-of charge capacity (e.g., corresponding with a 100% measured state of charge). In such approaches, any measured state of charge over a given value (e.g., a "full-charge" threshold value given by: 100−FC_DELTA) may be reported (e.g., by a battery fuel gauge) as the battery being 100% charged. Such approaches result in a reporting "dead band" where the reported state of charge (RSOC) value "sticks" at 100% in the dead band and does not decrease until the measured state of charge drops below the dead band. Such approaches result in RSOC appearing to decrease (e.g., as battery charge is consumed) in a non-linear fashion due to the RSOC being stuck at 100% while the battery's measured state of charge (MSOC) is within the dead band.

Figure 1:
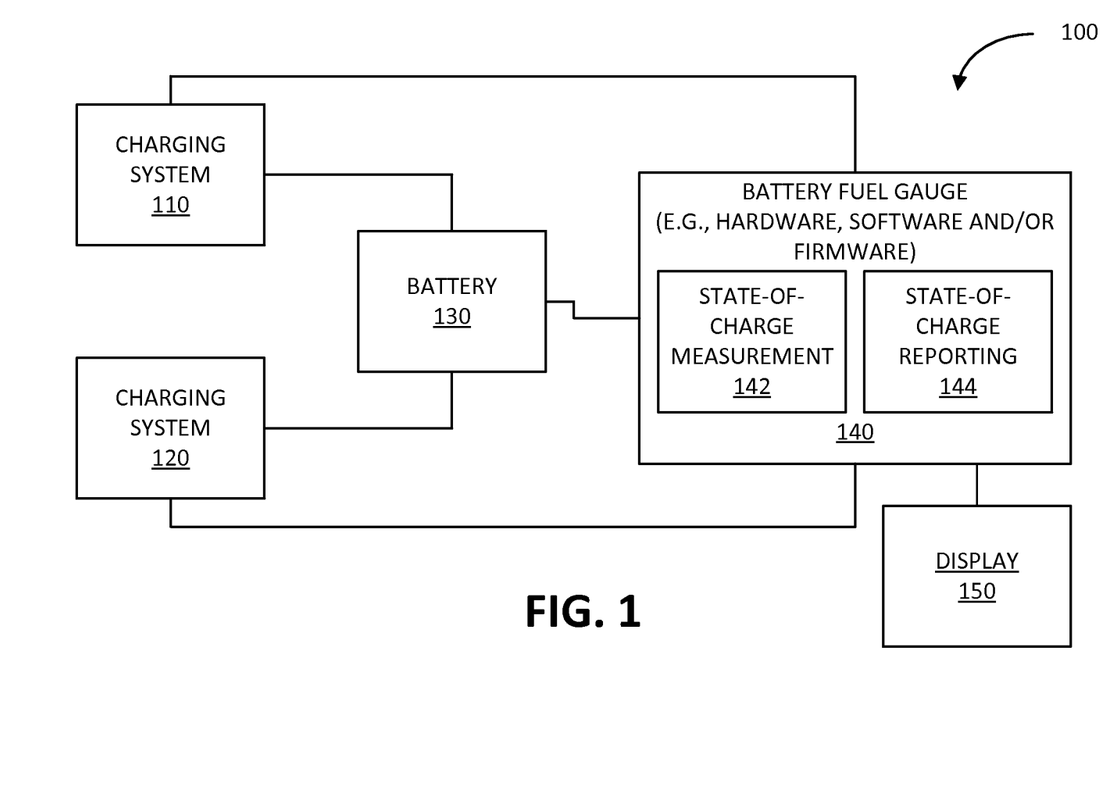
FIG. 1 is a block diagram illustrating a system, according to an implementation.

FIG. 1 is a block diagram illustrating a system 100, according to an implementation. The system 100 can be included in an electronic device, such as, for example, a smartphone, a tablet, a laptop computer, and so forth. The system 100 can be configured to charge a battery of an associated electronic device and also configured to provide reported state of charge (RSOC) values for the electronic device's battery, where the RSOC values can be scaled using the approaches described herein.

As shown in FIG. 1, the system 100 can include a first charging system 110 and a second charging system 120. The charging systems 110 and 120 can be different charging systems. For instance, the charging system 110 can be a wired charging system, while the charging system 120 can be a wireless charging system. As shown in FIG. 1, the charging systems 110 and 120 can be coupled with a battery 130. The charging systems 110 and 120 can be configured to provide electrical energy to the battery 130, in order to charge the battery (e.g., to increase a state-of-charge of the battery 130).

The charging systems 110 and 120 may also be configured to stop charging the battery 130 at a state-of-charge that is believed to be a "full state-of-charge" for the particular charging system. As noted above, a state-of-charge that is determined by the charging system 110 and/or the charging system 120 as being a "full" or "complete" can, in some instances, be less than the actual state-of-charge that the battery is capable of storing. The techniques described herein may be used in the system 100 to improve the linearity of RSOC values when such differences in "full" state-of charge (e.g., perceived state-of-charge versus actual state-of-charge capacity) occur.

As shown in FIG. 1, the system 100 can also include a battery fuel gauge 142, which can be implemented using hardware (e.g., a processor or controller), software (e.g., instructions stored on a non-transitory storage medium) and/or firmware in any appropriate combination. The battery fuel gauge 140 can include a state-of-charge measurement component 142 and a state-of charge reporting component 144. The state-of-charge measurement component 142 can include hardware, firmware and/or software that is configured to determine (measure) a state-of-charge of the battery 130. For instance, the state-of-charge measurement component 142 can continually or periodically measure the battery 130's state-of-charge. The state-of-charge reporting component 144 can include hardware, firmware and/or software that is configured to receive the information indicating measured state-of-charge (MSOC) from the state-of-charge measurement component 142, process (e.g., scale) that information (using the approaches described herein) and provide (and update) a corresponding RSOC (e.g., to a user), such as on a display (display screen) 150 of an associated electronic device (e.g., using a percentage between 0% and 100%).

As illustrated in FIG. 1, the charging system 110 and the charging system 120 may be further coupled with the battery fuel gauge 140. In the system 100, the charging systems 110 and 120 can be configured to provide respective signals to the battery fuel gauge 140 that indicate when an associated electronic device switches from a battery charging state to a battery discharging state, such as when a charger is disconnected or shut off, or a charging cycle has been completed (e.g., the charging system 110 or the charging system 120 determines the battery is fully charged). The charging systems 110 and 120 may be further configured to provide respective signals to the battery fuel gauge 140 that indicate when an associated electronic device switches from a battery discharging state to a battery charging state, such as if a charger is connected or activated.

Figure 2:
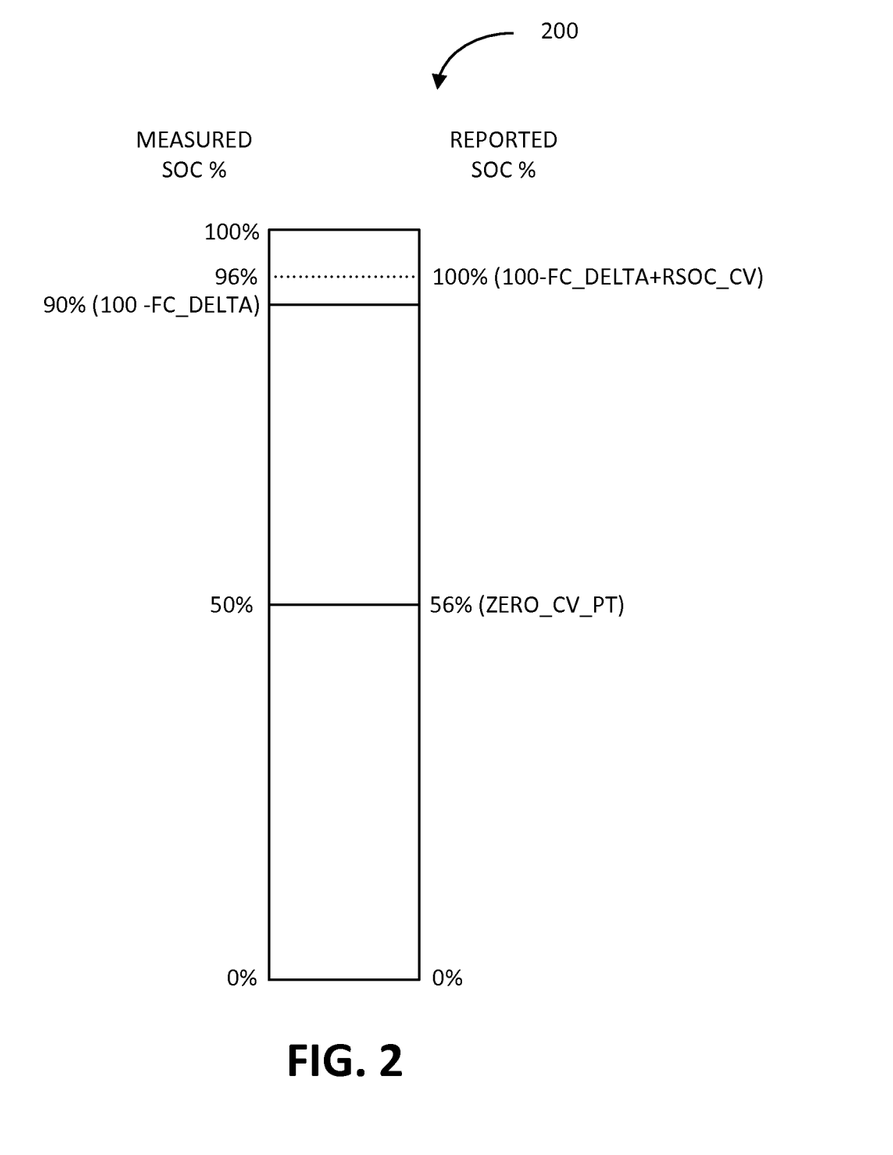
FIG. 2 is a diagram illustrating a comparison between measured state-of-charge and scaled reported state-of-charge, according to an implementation.

FIG. 2 is a diagram 200 illustrating an approach for RSOC scaling, according to an implementation. The approach shown in FIG. 2 may be implemented in the system 100 of FIG. 1. Accordingly, the diagram 200 will be described with further reference to FIG. 1. In other implementations, the approach shown in FIG. 2 may be implemented in systems having other configurations, such as in a system that includes only a single charging system, for example.

In the diagram 200, MSOC values (shown in percentage of battery capacity) are shown on the left side of the diagram, while RSOC (e.g., scaled) values are shown on the right side of the diagram. The specific values discussed with respect to FIG. 2 (as well as the values discussed with respect to other the other FIGs.) are given by way of example and for purposes of illustration. In other implementations or situations, values other than those discussed herein are possible. In the diagram 200, MSOC values of 0%, 50% and 100% are shown to illustrate the full scale for MSOC. Further, a MSOC value of 90% is shown as being 100%–FC_DELTA, where FC_DELTA (e.g., a buffer value) has a value of 10%.

The diagram 200 illustrates an example situation where, in response to receiving a signal (e.g., from the charging system 110 or the charging system 120) indicating that an associated electronic device has switched from a battery charging state to a battery discharging state, the state-of-charge measurement component 142 measures a state-of-charge of the battery 130. In this example, the MSOC value that is determined in response to the signal is shown as 96% (e.g., indicating a MSOC that is 4% less than the actual full state-of-charge capacity of the battery 130). In other implementations, the signal indicating that an associated electronic device has switched from a battery charging state to a battery discharging state could be generated by the battery fuel gauge 140. In still other implementation, other approaches are possible.

After the state-of-charge measurement component 142 determines that the MSOC is 96%, the state-of-charge measurement component 142 may provide that value to the state-of-charge reporting component 144. The state-of-charge reporting component 144 may then determine a reported state of charge compensation value (RSOC_CV) to use for scaling RSOC values. RSOC_CV may be determined using Equation 1 below:

$$RSOC\_CV = MSOC\_INIT - (100 - FC\_DELTA) \quad \text{(Equation 1)}$$

where MSOC_INIT, in this example, is the 96% value measured in response to the signal indicating the change from a battery charging state to a battery discharging state.

In this example, as discussed above, FC_DELTA is 10%. Accordingly, a compensation value may be determined as RSOC_CV=96−(100−90)=6 or 6%. The value of RSOC_CV may then be used to scale RSOC values for an associated electronic device. For instance, a scaled RSOC value may be given by Equation 2 below:

$$RSOC = \text{minimum}((MSOC/(100 - FC\_DELTA + RSOC\_CV))*100,100) \quad \text{(Equation 2)}$$

Accordingly, an RSOC value for MSOC_INIT may be given by minimum((96/(100−10+6))*100, 100)=minimum(100, 100), which represents a scaled RSOC value of 100% for a MSOC_INIT value of 96%.

Continuing with the foregoing example, the state-of-charge measurement component may detect a change in the MSOC of the battery 130. For example, the MSOC may decrease (e.g., as a result of usage of the associated electronic device) from 96% to 95%. In this situation, an updated, scaled RSOC value can be determined using RSOC_CV. Here, a scaled RSOC value corresponding with the MSOC value of 95% may be given by minimum((95/(100−10+6))*100, 100)=minimum((95/96)*100, 100) =minimum(98.96, 100), which represents a scaled RSOC value of 98.96% (or 99%) for a MSOC value of 95%, where the MSOC_INIT value was 96%. Without scaling the RSOC values using RSOC_CV, the RSOC value, using current approaches, would be "stuck" (or remain) at 100% until the MSOC drops below 90% thus appearing non-linear over the entire range of MSOC values.

In the implementation of FIG. 2, as MSOC decreases, a corresponding RSOC_CV may also be adjusted (amortized) over a given range of MSOC values (e.g., based on a predetermined MSOC value, such as using the techniques described herein). Such approaches may be advantageous as they can provide for a given RSOC_CV to be linearly reduced in proportion with corresponding decreases in MSOC. For instance, RSOC_CV may be linearly decreased (amortized) between MSOC_INIT and a zero compensation-value point (ZERO_CV_PT), eventually eliminating the compensation value when MSOC reaches ZERO_CV_PT.

In the example implementation of FIG. 2, such a ZERO_CV_PT is shown at a MSOC value of 50%. In this example, RSOC_CV may be reduced (amortized) by $\frac{1}{46}^{th}$ for each percentage point drop in MSOC for values between MSOC_INIT (96%) and the ZERO_CV_PT (MSOC=50%). By way of example, using such an approach, a scaled RSOC value for a MSOC value of 95% may be determined using an adjusted (amortized) RSOC_CV value of 5.87%, which is given by (6−(1/46)*6)=6−0.13. Such approaches may reduce non-linearity in RSOC values that would result from simply "resetting" RSOC_CV to zero (e.g., when MSOC reaches ZERO_CV_PT or 100−FC_DELTA, if the electronic device is charged again before RSOC_CV reaches zero at ZERO_CV_PT). In this example, RSOC at ZERO_CV_PT may be given by minimum((50/100−FC_DELTA−RSOC_CV)*100,100), where RSOC_CV will have been amortized to zero, therefore RSOC=minimum ((50/90)*100,100)=55.55% or 56%. In other implementations, ZERO_CV_PT may be set at other values of MSOC, such as, for example, 75%, 25%, 10%, 5% or 0%. Of course, other values of MSOC may be used to establish ZERO_CV_PT. In such approaches, the amortization of RSOC_CV will depend on the difference between MSOC_INIT and ZERO_CV_PT.

Continuing from the foregoing discussion, if an electronic device associated with the system 100 changes from a battery discharging state to a battery charging state before RSOC_CV has reached zero (e.g., before RSOC_CV has been fully amortized), the battery fuel gauge 140 (e.g., using the state-of-charge reporting component 144) may continue to amortize (reduce) RSOC_CV as the measured state of charge increases. In some implementations, an indication that the system 100 has changed from a battery discharging state to a battery charging state can be provided by the charging circuit 110 or the charging circuit 100. In other implementation, this indication can be provided by the battery fuel gauge 140. In still other implementations, other approaches are possible. In such an approach, the remaining value of RSOC_CV at the time when the change from a battery discharging state to a battery charging state occurs may then be amortized over the range of increasing MSOC values from the MSOC value at the time of the change through an MSOC value of 100−FC_DELTA. This amortization process may continue regardless of the number of changes between charging and discharging states until RSOC_CV reaches zero (e.g., MSOC drops to ZERO_CV_PT or MSOC reaches 100−FC_DELTA after dropping below 100−FC_DELTA).

For instance, continuing from the above example, if MSOC is at 75% when a first change from a battery discharging state to a battery charging state occurs, the initial RSOC_CV value of 6% will have been reduced (amortized) to 3.26, given by (6−(21/46)*6)=6−2.74. Accordingly, as MSOC increases during charging, RSOC_CV would be reduced by 0.217 (3.26/15), where 15 is the difference between the 75% MSOC value and 100−FC_DELTA (e.g., 90% in this example).

Figure 3:
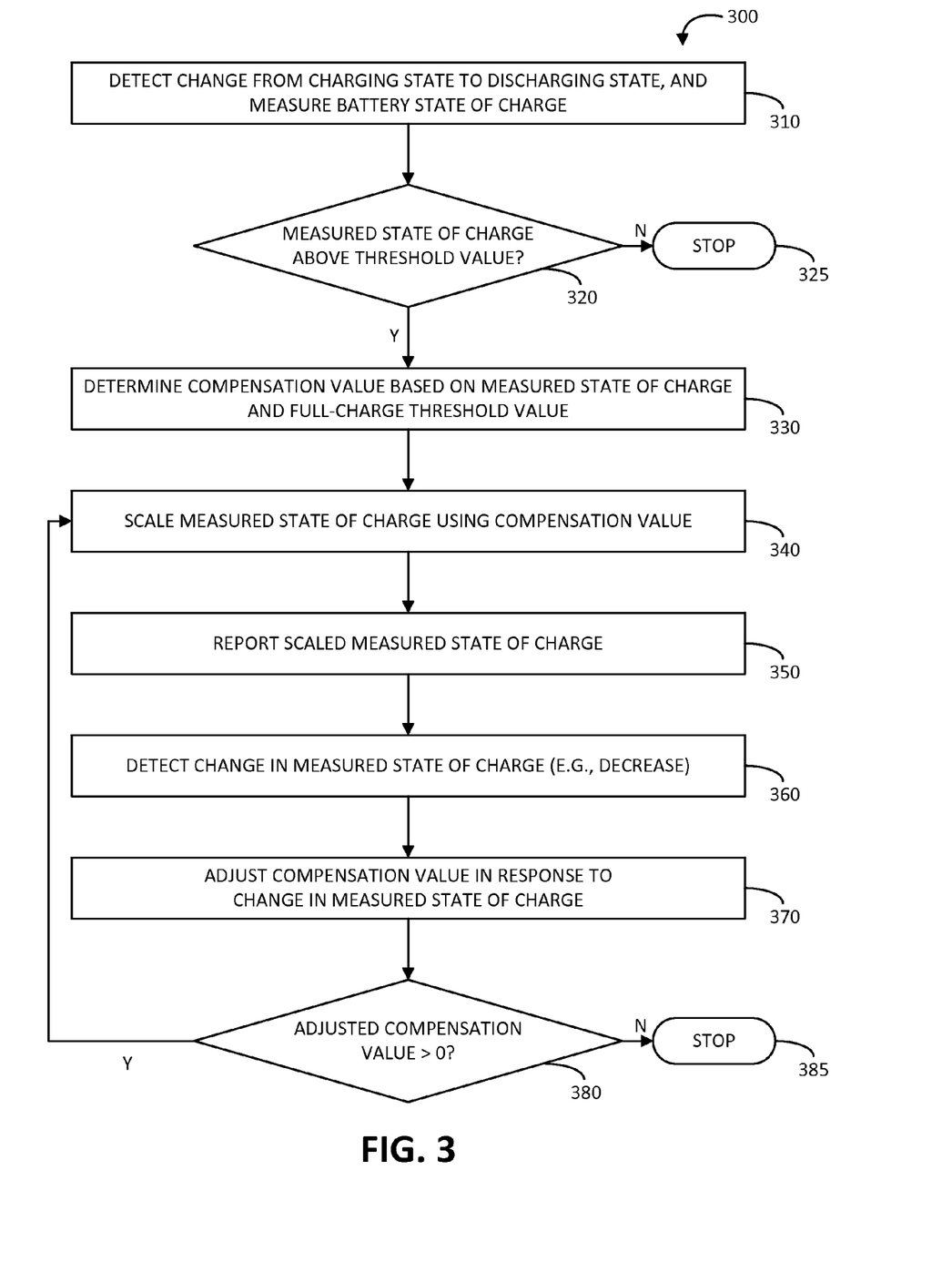
FIG. 3 is a flowchart illustrating a method for reporting scaled state-of-charge, according to an implementation.

FIG. 3 is a flowchart illustrating a method 300 for scaling MSOC values to corresponding RSOC values. The method 300 can be implemented using the techniques discussed above. Accordingly, for purposes of illustration, the method 300 will be described with further reference to FIGS. 1 and 2. In other implementations, the method 300 can be implemented using other approaches and/or implemented in apparatus having other configurations.

The method 300 includes, at block 310, detecting a change from a battery charging state to a battery discharging state in an electronic device. For instance, in the system 100, the change at block 310 can be detected by the battery fuel gauge 140 in response to a signal received from the charging system 110 or the charging system 120. At block 320, the method 300 includes determining an initial MSOC value (MSOC_INIT) after detecting the change from the charging state to the discharging state, and determining whether MSOC_INIT is above a threshold value, such as a threshold value of 100-FC_DELTA, as discussed above. If MSOC_INIT is not above the threshold value, the method 300 may terminate at block 325 and the state-of-charge reporting component 144 may report MSOC measurements (as corresponding RSOC values) without using RSOC_CV as a compensation value, e.g., using the equation RSOC=((MSOC/(100-FC_DELTA))*100). In other approaches, the RSOC values, in this situation, may be directly reported as the associated MSOC values (i.e., RSOC=MSOC).

If MSOC_INIT, at block 320, is above the threshold value, the method 300 continues to block 330 and the battery fuel gauge 140 can determine a compensation value based on MSOC_INIT and a full-charge threshold value (e.g., 100-FC_DELTA). For example, the compensation value may be determined as RSOC_CV using Equation 1, as was discussed above. At block 340, the method 300 includes scaling the MSOC (e.g., MSOC_INIT) using the compensation value (RSOC_CV). The scaling at block 340 can be done using Equation 2, which was described above. At block 350, the method 300 includes reporting the scaled MSOC of block 340.

At block 360, the method 360 includes detecting a change (e.g., decrease) in the MSOC of the battery 130. In response to detecting the change in the MSOC at block 360, the method 300 includes, at block 370, adjusting RSOC_CV (e.g., amortizing RSOC_CV as described herein). At block 380, the method 300 includes determining whether the adjusted compensation value (RSOC_CV) is greater than 0 (e.g., not fully amortized). If the adjusted RSOC_CV is greater than zero, the method 300 returns to block 340 and the new MSOC value is scaled and reported (at block 340 and 350). The system 100 can then wait, at block 360, for another change in the MSOC of the battery 130. If, at block 380, RSOC_CV is not greater than zero (e.g., RSOC_CV has been fully amortized), the method 300 may terminate at block 385 and MSOC of charge values can be reported without using RSOC_CV to scale the RSOC values, such as using the approaches described herein.

Figure 4:
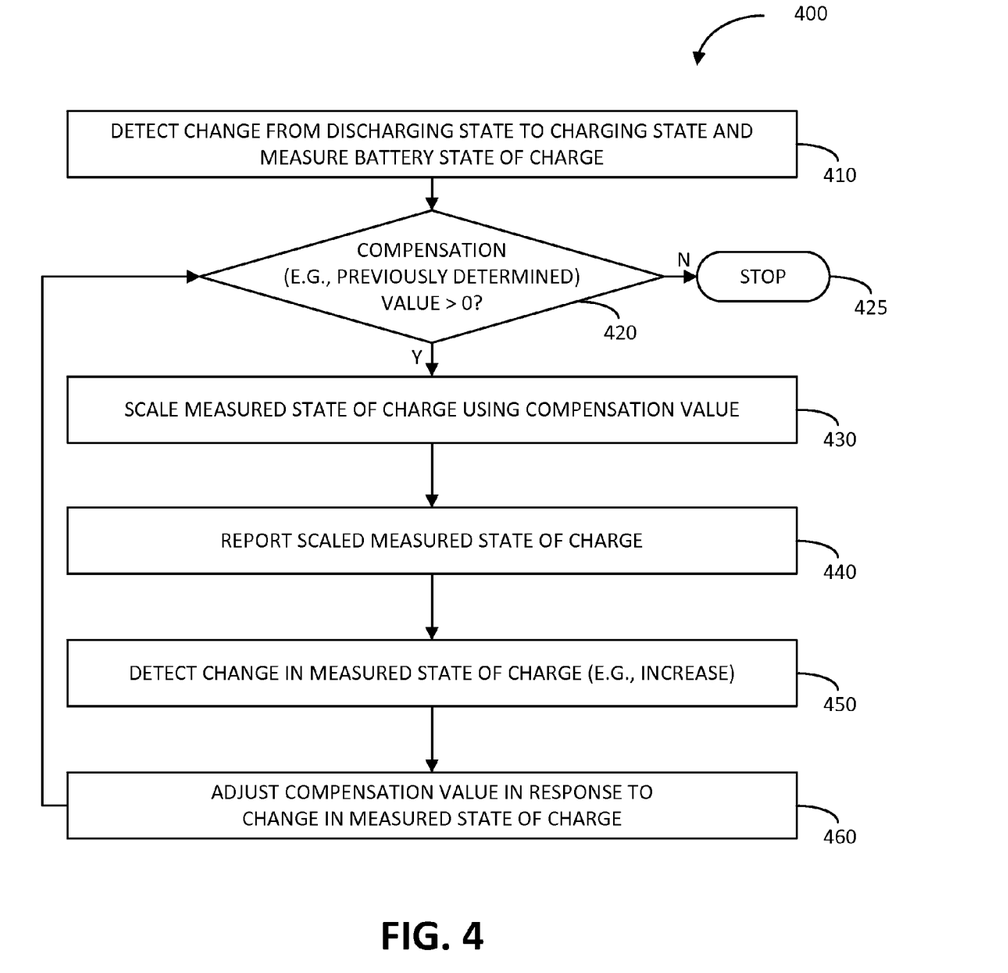
FIG. 4 is a flowchart illustrating another method for reporting scaled state-of-charge that can be implemented in conjunction with the method of FIG. 3, according to an implementation.

FIG. 4 is a flowchart illustrating another method 400 for scaling MSOC values to corresponding RSOC values. The method 400 can be implemented in conjunction with the method 300 and also implemented using the techniques discussed herein (e.g., with respect to FIGS. 1 and 2). Accordingly, for purposes of illustration, as with the method 300, the method 400 will be described with further reference to FIGS. 1 and 2. In other implementations, the method 400 can be implemented using other approaches and/or implemented in apparatus having other configurations.

The method 400 includes, at block 410, detecting a change from a battery discharging state to a battery charging state in an electronic device. For instance, in the system 100, the change at block 410 can be detected by the battery fuel gauge 140 in response to a signal received from the charging system 110 or the charging system 120. At block 420, the method 400 includes (e.g., in the system 100) determining whether the compensation value RSOC_CV is greater than zero, which indicates that a previously determined compensation value, RSOC_CV, has not yet been fully amortized. If RSOC_CV, at block 420, is not greater than 0 (e.g., a previously determined RSOC_CV has been fully amortized), the method 400 may terminate at block 425, and the state-of-charge reporting component 144 may report MSOC measurements (as corresponding RSOC values) without using RSOC_CV as a compensation value, such as using the approaches described herein.

If RSOC_CV, at block 420, is greater than zero, the method 400 continues to block 430 and a current MSOC value can be scaled using the current compensation value (e.g., partially amortized RSOC_CV). As in the method 300 at block 340, the scaling at block 430 can be done using Equation 2, which was described above. At block 440, the method 400 includes reporting the scaled MSOC of block 430.

At block 450, the method 450 can then wait until a change (e.g., increase) in the MSOC of the battery 130 is detected. The method can then proceed to block 460 and the current values of RSOC_CV can be adjusted (amortized) using the approaches described herein. The method 400 then returns to block 420 and a determination is made whether the adjusted compensation value of block 460 is greater than zero. The process of blocks 420-460 can be repeated, as described above, until RSOC_CV reaches zero (MSOC reaches (100-FC_DELTA)) and the method 400 terminates at block 425, or until another change between the charging state and the discharging state is detected. If a change from the charging state to the discharging state is detected before RSOC_CV reaches zero, the operations 420-460 of the method 400 may be used to scale MSOC values to corresponding RSOC values (where the changes in MSOC are decreases in MSOC) until RSOC_CV reaches zero (MSOC reaches ZERO_CV_PT) or another change between the discharging state and the charging state is detected.

In a general aspect, a method can include providing, by a battery charging circuit in an electronic device, an indication that the electronic device has changed from a battery charging state to a battery discharging state. The method can also include measuring, by the electronic device, an initial measured state-of-charge (MSOC) value of a battery of the electronic device. The method can also include, in the event the initial MSOC value is above a threshold value, determining a compensation value based on the initial MSOC value and the threshold value; determining an initial reported state of charge (RSOC) value by scaling the initial MSOC value using the compensation value; and reporting the initial RSOC value using the electronic device.

Implementations can include one or more of the following features. For instance, the threshold value can be a predetermined full-charge threshold value for the battery of the electronic device. The compensation value can be a difference between the initial MSOC value and the threshold value. The initial RSOC value can be a minimum value of a percentage value determined by the initial MSOC value divided by a sum of the threshold value and the compensation value and one-hundred percent. The reporting the initial RSOC value include displaying a percentage value corresponding with the initial RSOC value on a display of the electronic device.

The method can include detecting a decrease in a state-of-charge (SOC) of the battery from the initial MSOC value, and, in response to the detecting, measuring a changed MSOC value of the battery; determining a modified RSOC value by scaling the changed MSOC value using the compensation value; and reporting the modified RSOC value using the electronic device. The method can include, prior to determining the modified RSOC value, amortizing the compensation value based on a predetermined range of MSOC values to produce an amortized compensation value. The determining of the modified RSOC value can be based on the amortized compensation value.

The decrease in the SOC can be a first decrease, the changed MSOC value can be a first changed MSOC value, the amortized compensation value can be a first amortized compensation value, and the modified RSOC value can be a first modified RSOC value. The method can include detecting a second decrease in a state-of-charge (SOC) of the battery from the first changed MSOC value and, in response to the detecting the second decrease, measuring a second changed MSOC value of the battery and further amortizing the first amortized compensation value to determine a second amortized compensation value. In the event the second amortized compensation value is greater than zero, the method can include determining a second modified RSOC value by scaling the second changed MSOC value using the second amortized compensation value and reporting the second modified RSOC value using the electronic device.

In another general aspect, a method can include providing, by a battery charging circuit in an electronic device, an indication that the electronic device has changed from a battery discharging state to a battery charging state. The method can also include measuring, by the electronic device, an initial measured state-of-charge (MSOC) value of a battery of the electronic device. The method can further include determining whether a previously determined reported state of charge compensation value (RSOC_CV) of the electronic device is greater than zero. In the event the previously determined RSOC_CV is greater than zero, the method can also further include determining an initial reported state of charge (RSOC) value by scaling the initial MSOC value using the previously determined RSOC_CV and reporting the initial RSOC value using the electronic device.

Implementations can include one or more of the following features. For example, the initial RSOC value can be a minimum value of a percentage value determined by the initial MSOC value divided by a sum of a full-charge threshold value of the electronic device and the previously determined RSOC_CV and one-hundred percent. The reporting of the initial RSOC value can include displaying a percentage value corresponding with the initial RSOC value on a display of the electronic device.

The method can include detecting an increase in a state-of-charge (SOC) of the battery from the initial MSOC value and, in response to the detecting, measuring a changed MSOC value of the battery; determining a modified RSOC value by scaling the changed MSOC value using the previously determined RSOC_CV; and reporting the modified RSOC value using the electronic device.

The method can include detecting an increase in a state-of-charge (SOC) of the battery from the initial MSOC value. In response to the detecting, the method can include measuring a changed MSOC value of the battery; amortizing the previously determined RSOC_CV to determine an amortized RSOC_CV, where the amortizing can be across a range of MSOC values determined by a difference between a full-charge threshold value and the initial MSOC value; determining a modified RSOC value by scaling the changed MSOC value using the amortized RSOC_CV; and reporting the modified RSOC value using the electronic device.

The increase in the SOC can be a first increase in the SOC, the changed MSOC value can be a first changed MSOC value, the amortized RSOC_CV can be a first amortized RSOC_CV, and the modified RSOC value can be a first modified RSOC value. The method can include detecting a second increase in a state-of-charge (SOC) of the battery from the first changed MSOC value. In response to the detecting the second increase, the method can include measuring a second changed MSOC value of the battery and further amortizing the first amortized RSOC_CV to determine a second amortized RSOC_CV. In the event the second amortized RSOC_CV is greater than zero, the method can include determining a second modified RSOC value by scaling the second changed MSOC value using the second amortized RSOC_CV and reporting the second modified RSOC value using the electronic device.

In another general aspect, an electronic device can include a battery, a charging circuit, a battery fuel gauge operatively coupled with the battery and the charging circuit, at least one processor and at least one non-transitory storage medium having instructions stored thereon. The instructions, when executed by the at least one processor, can result in the charging circuit providing, to the battery fuel gauge, an indication that the electronic device has changed from a battery charging state to a battery discharging state and measuring, by the battery fuel gauge, an initial measured state-of-charge (MSOC) value of the battery. In the event the initial MSOC value is above a threshold value, the instructions, when executed by the at least one processor, can cause the battery fuel gauge to determine a compensation value based on the initial MSOC value and the threshold value; determine an initial reported state of charge (RSOC) value by scaling the initial MSOC value using the compensation value; and report the initial RSOC value on a display of the electronic device.

Implementations can include one or more of the following features. For example, the instructions, when executed by the at least one processor, can cause the battery fuel gauge to detect a decrease in a state-of-charge (SOC) of the battery from the initial MSOC value and, in response to the detecting, measure a changed MSOC value of the battery; amortize the compensation value to determine an amortized compensation value, the amortizing being across a range of MSOC values; determine a modified RSOC value by scaling the changed MSOC value using the amortized compensation; and report the modified RSOC value using the electronic device.

The decrease in the SOC can be a first decrease, the changed MSOC value can be a first changed MSOC value, the amortized compensation value can be a first amortized compensation value, and the modified RSOC value can be a first modified RSOC value. The instructions, when executed by the at least one processor, can cause the battery fuel gauge to detect a second decrease in a state-of-charge (SOC) of the battery from the first changed MSOC value and, in response to the detecting the second decrease, measure a second changed MSOC value of the battery and further amortize the compensation value to determine a second amortized compensation value. In the event the second amortized compensation value is greater than zero, the instructions, when executed by the at least one processor, can cause the battery fuel gauge to determine a second modified RSOC value by scaling the second changed MSOC value using the second amortized compensation value and report the second modified RSOC value using the electronic device.

The charging circuit can be a first charging circuit. The electronic device can include a second charging circuit that is operatively coupled with the battery and the battery fuel gauge. The second charging circuit can be configured to provide the indication that the electronic device has changed from the battery charging state to the battery discharging state.

In another general aspect, an electronic device can include a battery, a charging circuit, a battery fuel gauge operatively coupled with the battery and the charging circuit, at least one processor and at least one non-transitory storage medium having instructions stored thereon. The instructions, when executed by the at least one processor, can result in the charging circuit providing, to the battery fuel gauge, an indication that the electronic device has changed from a battery discharging state to a battery charging state; measuring, by the battery fuel gauge, an initial measured state-of-charge (MSOC) value of a battery of the electronic device; and determining whether a previously determined reported state of charge compensation value (RSOC_CV) of the electronic device is greater than zero. In the event the previously determined RSOC_CV is greater than zero, the instructions, when executed by the at least one processor, can cause the battery fuel gauge to determine an initial reported state of charge (RSOC) value by scaling the initial MSOC value using the previously determined RSOC_CV and report the initial RSOC value using the electronic device.

Implementations can include one or more of the following features. For instance, the instructions, when executed by the at least one processor, can cause the battery fuel gauge to detect an increase in a state-of-charge (SOC) of the battery from the initial MSOC value and, in response to the detecting, measure a changed MSOC value of the battery and amortize the previously determined RSOC_CV to produce an amortized RSOC_CV, the amortizing being across a range of MSOC values determined by a difference between a full-charge threshold value and the initial MSOC value. In the event the amortized RSOC_CV is greater than zero, the instructions, when executed by the at least one processor, can cause the battery fuel gauge to determine a modified RSOC value by scaling the changed MSOC value using the amortized RSOC_CV and report the modified RSOC value using a display of the electronic device.

The increase in the SOC can be a first increase in the SOC, the changed MSOC value can be a first changed MSOC value, the amortized RSOC_CV can be a first amortized RSOC_CV and the modified RSOC value can be a first modified RSOC value. The instructions, when executed by the at least one processor, can cause the battery fuel gauge to detect a second increase in a state-of-charge (SOC) of the battery from the first changed MSOC value. In response to the detecting the second increase, the instructions, when executed by the at least one processor, can cause the battery fuel gauge to measure a second changed MSOC value of the battery and further amortize the first amortized RSOC_CV to determine a second amortized RSOC_CV. In the event the second amortized RSOC_CV is greater than zero, the instructions, when executed by the at least one processor, can cause the battery fuel gauge to determine a second modified RSOC value by scaling the second changed MSOC value using the second amortized RSOC_CV and report the second modified RSOC value using display of the electronic device.

The charging circuit can be a first charging circuit. The electronic device can include a second charging circuit that is operatively coupled with the battery and the battery fuel gauge. The second charging circuit can be configured to provide the indication that the electronic device has changed from the battery discharging state to the battery charging state.

Implementations of the various techniques described herein may be implemented in digital electronic circuitry, or in computer hardware, firmware, software, or in combinations of them. Implementations may implemented as a computer program product, i.e., a non-transitory computer program tangibly embodied in an information carrier, e.g., in a machine-readable storage device (e.g., a computer-readable medium, a tangible computer-readable medium), for processing by, or to control the operation of, data processing apparatus, e.g., a programmable processor, a computer, or multiple computers. In some implementations, a non-transitory tangible computer-readable storage medium can be configured to store instructions that when executed cause a processor to perform a process. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communications network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT), a light emitting diode (LED), or liquid crystal display (LCD) display device, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method for reporting battery state of charge, the method comprising:
   receiving, by a battery fuel gauge, a signal from a charging circuit of an electronic device, the charging circuit being communicatively coupled to the battery fuel gauge;
   determining, by the battery fuel gauge, that the electronic device has changed from a battery charging state to a battery discharging state in response to the signal;
   measuring, by the battery fuel gauge, an initial measured state-of-charge (MSOC) value of a battery of the electronic device; and
   if the initial MSOC value is above a threshold value:
      determining, by the battery fuel gauge, a reported state-of-charge compensation value (RSOC_CV) based on a difference between the initial MSOC value and the threshold value;
      scaling, by the battery fuel gauge, the initial MSOC value using the RSOC_CV to obtain an initial reported state-of-charge (RSOC) value; and
      triggering, by the battery fuel gauge, display of the initial RSOC value on a display screen of the electronic device, wherein, as an MSOC value decreases over time, a corresponding RSOC value is adjusted and displayed over a range of MSOC values such that the displayed RSOC value linearly decreases over time.

2. The method of claim 1, wherein the threshold value is a predetermined full-charge threshold value for the battery of the electronic device.

3. The method of claim 1, wherein the RSOC_CV is a difference between the initial MSOC value and the threshold value.

4. The method of claim 1, wherein the initial RSOC value is a minimum value of:
   a percentage value determined by the initial MSOC value divided by a sum of the threshold value and the RSOC_CV; and
   one-hundred percent.

5. The method of claim 1, wherein the reporting the initial RSOC value includes displaying a percentage value corresponding with the initial RSOC value on a display of the electronic device.

6. The method of claim 1, further comprising:
   detecting a decrease in a state-of-charge (SOC) of the battery from the initial MSOC value; and
   in response to the detecting the decrease:
      measuring a changed MSOC value of the battery;
      determining a modified RSOC value by scaling the changed MSOC value using the RSOC_CV; and
      reporting the modified RSOC value using the electronic device.

7. The method of claim 6, further comprising, prior to determining the modified RSOC value, amortizing the RSOC_CV based on a predetermined range of MSOC values to produce an amortized RSOC_CV, the determining of the modified RSOC value being based on the amortized RSOC_CV.

8. The method of claim 7, wherein the decrease in the SOC is a first decrease, the changed MSOC value is a first changed MSOC value, the amortized RSOC_CV is a first amortized RSOC_CV, and the modified RSOC value is a first modified RSOC value, the method further comprising:
   detecting a second decrease in a state-of-charge (SOC) of the battery from the first changed MSOC value;
   in response to the detecting the second decrease:
      measuring a second changed MSOC value of the battery;
      further amortizing the first amortized RSOC_CV to determine a second amortized RSOC_CV; and
      if the second amortized RSOC_CV is greater than zero:
         determining a second modified RSOC value by scaling the second changed MSOC value using the second amortized RSOC_CV; and
         reporting the second modified RSOC value using the electronic device.

9. The method of claim 1, wherein the initial MSOC value is a first initial MSOC and the initial RSOC value is a first initial RSOC value, the method further comprising:
   determining, by the electronic device, that the electronic device has changed from a battery discharging state to a battery charging state;
   measuring, by the electronic device, a second initial measured state-of-charge (MSOC) value of the battery of the electronic device;
   determining whether the RSOC_CV is greater than zero; and
   if the RSOC_CV is greater than zero:
      determining a second initial RSOC value by scaling the second initial MSOC value using the RSOC_CV; and
      reporting the second initial RSOC value using the electronic device.

10. The method of claim 9, wherein the second initial RSOC value is a minimum value of:
   a percentage value determined by the second initial MSOC value divided by a sum of a full-charge threshold value of the electronic device and the RSOC_CV; and
   one-hundred percent.

11. The method of claim 9, wherein the reporting the second initial RSOC value includes displaying a percentage value corresponding with the second initial RSOC value on a display of the electronic device.

12. The method of claim 9, further comprising:
   detecting an increase in a state-of-charge (SOC) of the battery from the second initial MSOC value; and
   in response to the detecting the increase:
      measuring a changed MSOC value of the battery;
      determining a modified RSOC value by scaling the changed MSOC value using the RSOC_CV; and
      reporting the modified RSOC value using the electronic device.

13. The method of claim 9, further comprising:
   detecting an increase in a state-of-charge (SOC) of the battery from the second initial MSOC value; and
   in response to the detecting the increase:
      measuring a changed MSOC value of the battery;
      amortizing the RSOC_CV to determine an amortized RSOC_CV, the amortizing being across a range of MSOC values determined by a difference between a full-charge threshold value and the initial MSOC value;
      determining a modified RSOC value by scaling the changed MSOC value using the amortized RSOC_CV; and
      reporting the modified RSOC value using the electronic device.

14. The method of claim 13, wherein the increase in the SOC is a first increase in the SOC, the changed MSOC value is a first changed MSOC value, the amortized RSOC_CV is a first amortized RSOC_CV, and the modified RSOC value is a first modified RSOC value, the method further comprising:
   detecting a second increase in a state-of-charge (SOC) of the battery from the first changed MSOC value; and
   in response to the detecting the second increase:
      measuring a second changed MSOC value of the battery;
      further amortizing the first amortized RSOC_CV to determine a second amortized RSOC_CV; and
      if the second amortized RSOC_CV is greater than zero:
         determining a second modified RSOC value by scaling the second changed MSOC value using the second amortized RSOC_CV; and
         reporting the second modified RSOC value using the electronic device.

15. An electronic device configured to report battery state of charge, the electronic device comprising:
   a battery;
   a charging circuit;
   a battery fuel gauge operatively coupled with the battery and the charging circuit;
   at least one processor; and
   at least one non-transitory storage medium having instructions stored thereon, the instructions, when executed by the at least one processor, result in:
      in response to the electronic device changing from a battery charging state to a battery discharging state, the battery fuel gauge receiving a signal indicating the change;
      in response to the change, measuring, by the battery fuel gauge, an initial measured state-of-charge (MSOC) value of the battery; and
      if the initial MSOC value is above a threshold value, the instructions, when executed by the at least one processor, cause the battery fuel gauge to:
         determine a reported state-of-charge compensation value (RSOC_CV) based on a difference between the initial MSOC value and the threshold value;
         scale the initial MSOC value using the RSOC_CV to obtain an initial reported state-of-charge (RSOC) value; and
         report the initial RSOC value, wherein, as an MSOC value decreases over time, a corresponding RSOC value is adjusted over a range of MSOC values such that the adjusted RSOC value linearly decreases over time.

16. The electronic device of claim 15, wherein the instructions, when executed by the at least one processor, further cause the battery fuel gauge to:
   detect a decrease in a state-of-charge (SOC) of the battery from the initial MSOC value; and
   in response to the detecting the decrease:
      measure a changed MSOC value of the battery;
      amortize the RSOC_CV to determine an amortized RSOC_CV, the amortizing being across a range of MSOC values;
      determine a modified RSOC value by scaling the changed MSOC value using the amortized RSOC_CV; and
      report the modified RSOC value using the electronic device.

17. The electronic device of claim 16, wherein the decrease in the SOC is a first decrease, the changed MSOC value is a first changed MSOC value, the amortized RSOC_CV is a first amortized RSOC_CV, and the modified RSOC value is a first modified RSOC value, the instructions, when executed by the at least one processor, further cause the battery fuel gauge to:
   detect a second decrease in a state-of-charge (SOC) of the battery from the first changed MSOC value; and
   in response to the detecting the second decrease:
      measure a second changed MSOC value of the battery;
      further amortize the first amortized RSOC_CV to determine a second amortized RSOC_CV; and
      if the second amortized RSOC_CV is greater than zero:
         determine a second modified RSOC value by scaling the second changed MSOC value using the second amortized RSOC_CV; and
         report the second modified RSOC value using the electronic device.

18. The electronic device of claim 15, wherein the initial MSOC value is a first initial MSOC and the initial RSOC value is a first initial RSOC value, the instructions, when executed by the at least one processor, further resulting in:
   the battery fuel gauge receiving an indication that the electronic device has changed from a battery discharging state to a battery charging state;
   measuring, by the battery fuel gauge, a second initial measured state-of-charge (MSOC) value of the battery of the electronic device;
   determining whether the RSOC_CV is greater than zero; and
   if the RSOC_CV is greater than zero, the instructions, when executed by the at least one processor, cause the battery fuel gauge to:
      determine a second initial RSOC value by scaling the second initial MSOC value using the RSOC_CV; and
      report the initial RSOC value using the electronic device.

19. The electronic device of claim 18, wherein the instructions, when executed by the at least one processor, further cause the battery fuel gauge to:
  detect an increase in a state-of-charge (SOC) of the battery from the second initial MSOC value; and
  in response to the detecting the increase:
    measure a changed MSOC value of the battery;
    amortize the RSOC_CV to produce an amortized RSOC_CV, the amortizing being across a range of MSOC values determined by a difference between a full-charge threshold value and the initial MSOC value; and
    if the amortized RSOC_CV is greater than zero:
      determine a modified RSOC value by scaling the changed MSOC value using the amortized RSOC_CV; and
      report the modified RSOC value using a display of the electronic device.

20. The electronic device of claim 19, wherein the increase in the SOC is a first increase in the SOC, the changed MSOC value is a first changed MSOC value, the amortized RSOC_CV is a first amortized RSOC_CV and the modified RSOC value is a first modified RSOC value, the instructions, when executed by the at least one processor, further cause the battery fuel gauge to:
  detect a second increase in a state-of-charge (SOC) of the battery from the first changed MSOC value; and
  in response to the detecting the second increase:
    measure a second changed MSOC value of the battery;
    further amortize the first amortized RSOC_CV to determine a second amortized RSOC_CV; and
    if the second amortized RSOC_CV is greater than zero:
      determine a second modified RSOC value by scaling the second changed MSOC value using the second amortized RSOC_CV; and
      report the second modified RSOC value using the display of the electronic device.

* * * * *